United States Patent
Kim

(10) Patent No.: US 7,700,472 B2
(45) Date of Patent: Apr. 20, 2010

(54) METHOD OF FORMING A GATE OF A SEMICONDUCTOR DEVICE

(75) Inventor: Soo Jin Kim, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 168 days.

(21) Appl. No.: 11/761,281

(22) Filed: Jun. 11, 2007

(65) Prior Publication Data
US 2008/0160747 A1 Jul. 3, 2008

(30) Foreign Application Priority Data
Dec. 28, 2006 (KR) .................. 10-2006-0136344

(51) Int. Cl.
*H01L 21/3205* (2006.01)
*H01L 21/4763* (2006.01)
(52) U.S. Cl. .............. 438/593; 438/241; 438/595; 438/629; 257/E21.02; 257/E21.019; 257/E21.495
(58) Field of Classification Search .......... 438/593, 438/595, 629, 241; 257/E21.2, E21.019, 257/E21.312, E21.495
See application file for complete search history.

(56) References Cited

U.S. PATENT DOCUMENTS 5,796,151 A 8/1998 Hsu et al.
5,998,290 A * 12/1999 Wu et al. ................. 438/595
2003/0077860 A1* 4/2003 Tu ........................... 438/241
2005/0164479 A1* 7/2005 Perng et al. ............... 438/591
2006/0068510 A1* 3/2006 Urban et al. ................. 438/6

FOREIGN PATENT DOCUMENTS

KR 1020030036061 A 5/2003

* cited by examiner

*Primary Examiner*—Alexander G Ghyka
*Assistant Examiner*—Abdulfattah Mustapha
(74) *Attorney, Agent, or Firm*—Townsend and Townsend and Crew LLP

(57) ABSTRACT

A method of forming a gate of a semiconductor device includes providing a semiconductor substrate over which a first conductive layer, a dielectric layer and a second conductive layer are formed. The second conductive layer is patterned to expose a part of the dielectric layer. A first protection layer is formed on sidewalls of the second conductive layer. A first etch process is performed to remove the exposed dielectric layer and to expose a part of the first conductive layer. A second protection layer is formed on sidewalls of the second conductive layer. A second etch process is performed to remove the exposed first conductive layer.

16 Claims, 4 Drawing Sheets

METHOD OF FORMING A GATE OF A SEMICONDUCTOR DEVICE

CROSS-REFERENCES TO RELATED APPLICATIONS

The present application claims priority to Korean patent application number 10-2006-136344, filed on Dec. 28, 2006, which is incorporated by reference in its entirety.

BACKGROUND OF THE INVENTION

The present invention relates, in general, to semiconductor devices and, more particularly, to a method of forming a gate of a semiconductor device, which prevents a bowing profile from occurring during a gate etch process.

A NAND flash memory device has non-volatile memory properties including programming and erase characteristics, and a structure that is advantageous for high integration. The flash memory device has a structure in which a floating gate and a control gate are formed over a semiconductor substrate with a dielectric layer disposed therebetween. A gate insulating layer is formed below the floating gate.

The NAND flash memory device is formed by laminating the gate insulating layer, the floating gate, the dielectric layer, the control gate, etc., over the semiconductor substrate and then patterning by a gate etch process. This process is performed using etch conditions suitable for material for forming the respective layers in an in-situ manner. However, layers other than etch targets are patterned and sidewalls of the layers are exposed. Accordingly, problems arise because the layers other than the etch targets are unnecessarily etched and bowing occurs on sidewalls of a gate pattern.

SUMMARY OF THE INVENTION

Accordingly, the present invention addresses the above problems, and discloses a method of forming a gate of a semiconductor device in which sidewalls of layers other than etch targets are protected by a buffer layer. A gate etch process is then performed such that a bowing profile is not generated on sidewalls of a gate pattern.

In one embodiment, a method of forming a gate of a semiconductor device includes providing a semiconductor substrate over which a first conductive layer, a dielectric layer and a second conductive layer are formed. The second conductive layer is patterned to expose a part of the dielectric layer. A first protection layer is formed on sidewalls of the second conductive layer. A first etch process is performed to remove the exposed dielectric layer thereby exposing a part of the first conductive layer. A second protection layer is formed on sidewalls of the second conductive layer. A second etch process is performed to remove the exposed first conductive layer.

DESCRIPTION OF SPECIFIC EMBODIMENTS

A specific embodiment according to the present patent will be described with reference to the accompanying drawings.

FIGS. 1A to 1H are cross-sectional views illustrating a method of forming a gate of a semiconductor device according to the present invention.

Figure 1A:
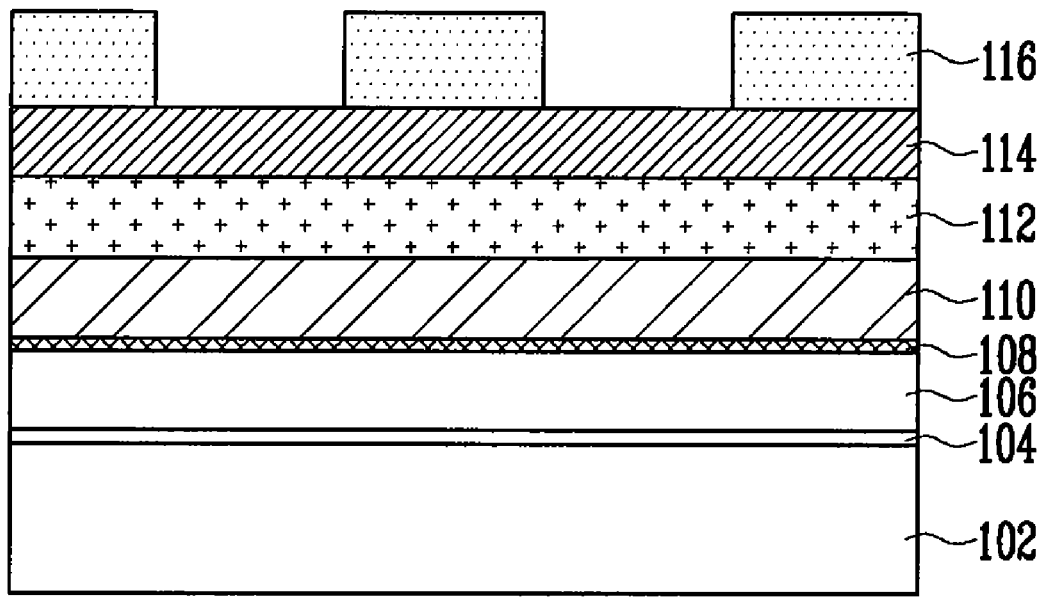
FIGS. 1A to 1H are cross-sectional views illustrating a method of forming a gate of a semiconductor device according to the present invention.

Referring to FIG. 1A, a gate insulating layer 104, a first conductive layer 106 for a floating gate, and a pad nitride layer (not illustrated) are sequentially formed over a semiconductor substrate 102. The first conductive layer 106 can be formed of polysilicon. A photoresist pattern (not illustrated) is formed on specific regions on the pad nitride layer. The pad nitride layer, the first conductive layer 106, the gate insulating layer 104 and the semiconductor substrate 102 are partially etched at a specific depth using the photoresist pattern as an etch mask, thereby forming trenches (not illustrated).

The trenches are filled with an insulating layer, such as a High Density Plasma (HDP) oxide layer, an $O_3$-TEOS oxide layer or a Spin On Glass (SOG) oxide layer. A polishing process, such as Chemical Mechanical Polishing (CMP), is performed until the pad nitride layer is exposed and the pad nitride layer is then removed, thereby forming isolating layers (not illustrated). An active region is defined in the semiconductor substrate 102 through the isolating layers.

A dielectric layer 108, a second conductive layer 110 for a control gate, a metal layer 112 and a hard mask 114 are formed over the entire surface including the isolating layers. The dielectric layer 108 can have an Oxide/Nitride/Oxide (ONO) structure, or a structure in which a high dielectric layer is formed between insulating layers. The metal layer 112 can be formed using metal material, such as tungsten silicide (WSix). A gate photoresist pattern 116 is formed on specific regions on the hard mask 114.

Figure 1B:
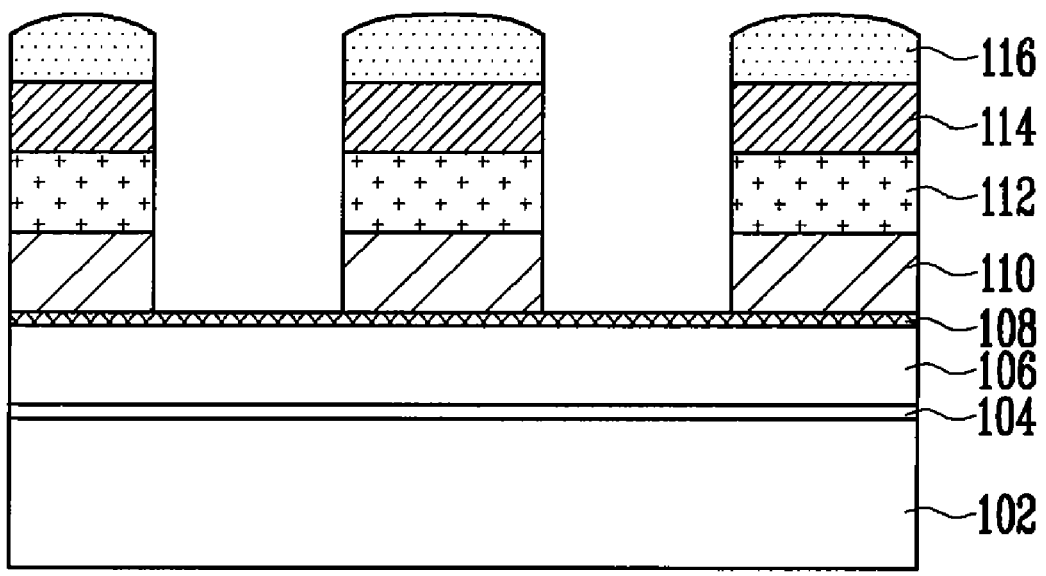

Referring to FIG. 1B, the hard mask 114, the metal layer 112 and the second conductive layer 110 are partially etched and patterned by an etch process using the gate photoresist pattern 116 as an etch mask. The etch process can be performed in-situ under process conditions suitable for film quality characteristics. The etch process is complete when the dielectric layer 108 is exposed. The etch process can be implemented such that the polysilicon layer is etched more deeply than the oxide layer.

Figure 1C:
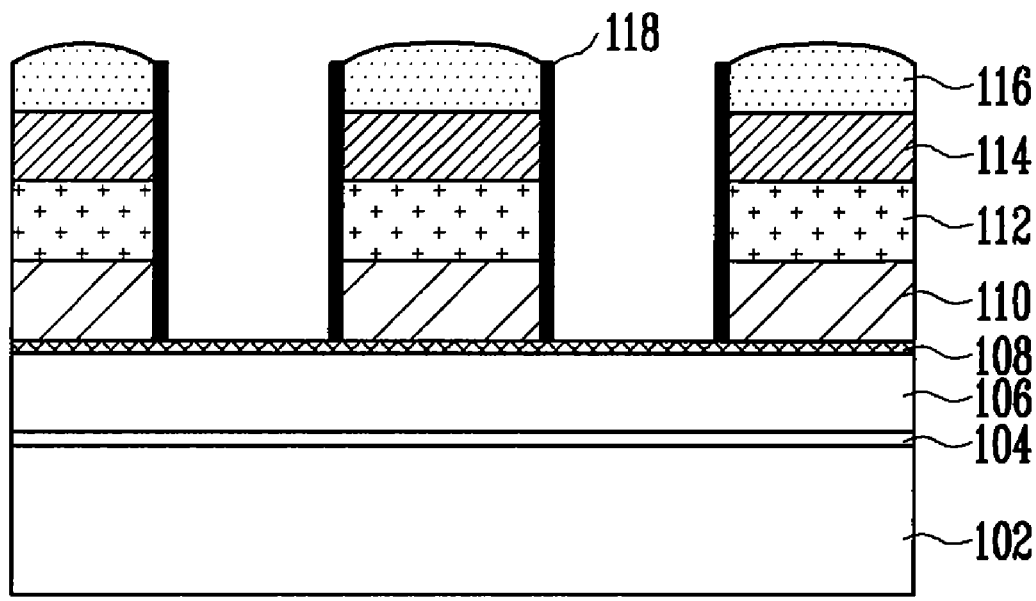

Referring to FIG. 1C, a first protection layer 118, having an etch selectivity that is different from that of the second conductive layer 110, is formed on the sidewalls of the stack layer patterns 110, 112 and 114. The first protection layer 118 is formed using an oxide layer. The oxide layer can be formed by a plasma oxidization method employing a mixed gas of Ar and $O_2$.

Figure 1D:
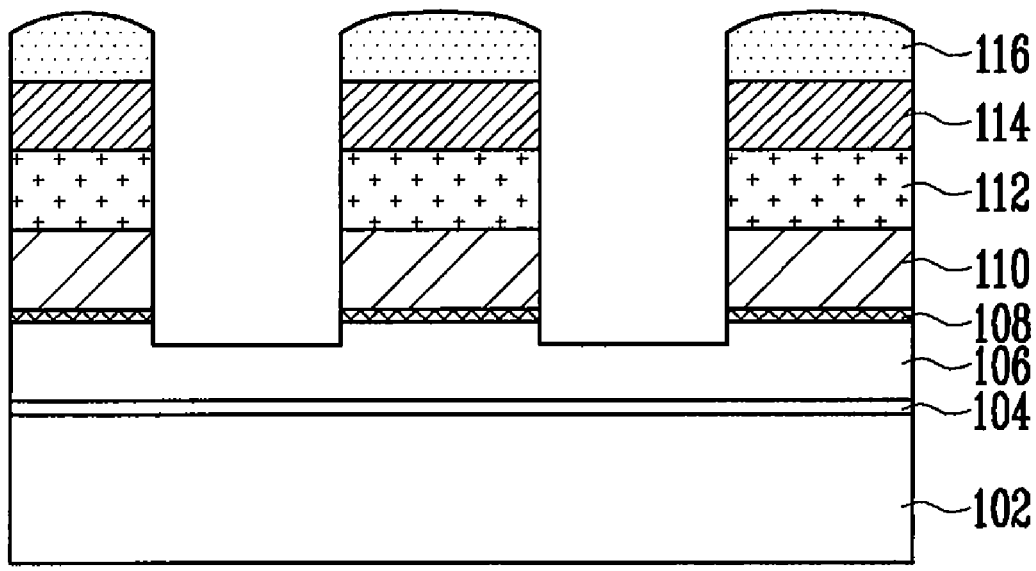

Referring to FIG. 1D, the exposed dielectric layer 108 is etched and removed. The first protection layer 118 (refer to FIG. 1C), which is formed by the above process, is also removed. While the first protection layer 118 is being removed, the sidewalls of the stack layer patterns 110, 112 and 114 are protected. Thus, bowing is not generated on the sidewalls of the stack layer patterns 110, 112 and 114.

In order to further prevent bowing from being generated on the sidewalls of the stack layer patterns 110, 112 and 114, a dry etch process employing $CF_4$ can be performed such that an oxide layer is etched more than polysilicon when etching the dielectric layer 108. For example, the dry etch process is performed such that the etch selectivity of polysilicon and the oxide layer ranges from approximately 1:2 to approximately 1:5. If the dielectric layer 108 is over-etched to completely remove the dielectric layer 108, the first conductive layer 106 formed below the dielectric layer 108 may be partially etched.

Figure 1E:
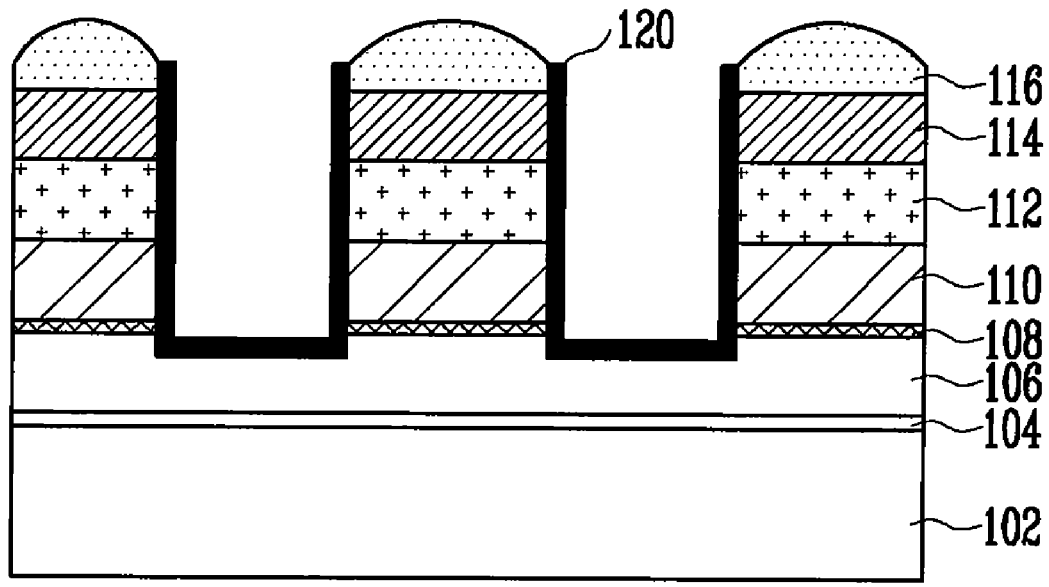

Referring to FIG. 1E, a second protection layer 120, having an etch selectivity that is different from that of the second conductive layer 110 and the first conductive layer 106, is formed on the sidewalls of the stack layer patterns 108 to 114.

The second protection layer 120 can be formed using an oxide layer. The second protection layer 120 can be formed by a plasma oxidization method employing a mixed gas of Ar and $O_2$.

Figure 1F:
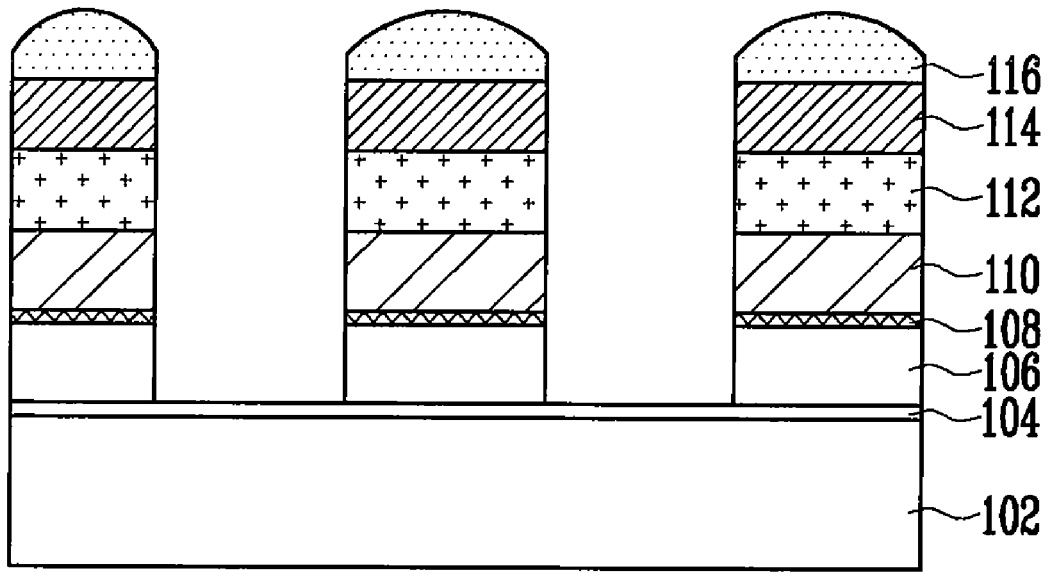

Referring to FIG. 1F, an etch process is performed on the first conductive layer 106 to pattern the first conductive layer 106. The second protection layer 120 (refer to FIG. 1E) protects the sidewalls of the stack layer patterns 108 to 114. Accordingly, bowing does not occur on the sidewalls of the stack layer patterns 108 to 114.

The etch process that is performed on the first conductive layer 106 includes performing a main etch process and an over-etch process to effectively remove the first conductive layer 106. In order to perform the main etch process on the first conductive layer 106, a dry etch process employing a mixed gas of HBr and He is performed such that the polysilicon layer is etched more than the oxide layer. Alternatively, the polysilicon layer and the oxide layer are equally etched. For example, the dry etch process is performed under conditions in which the etch selectivity of the polysilicon layer and the oxide layer ranges from approximately 1:1 to approximately 5:1. In order to perform an over-etch when the first conductive layer 106 is almost entirely removed, a dry etch employing a mixed gas of HBr and $O_2$ is performed such that the polysilicon layer is etched more than the oxide layer. For example, the dry etch is performed under conditions in which the etch selectivity of the polysilicon layer and the oxide layer ranges from approximately 10:1 to approximately 30:1. If etch remnants of the first conductive layer 106, which were generated during the main etch, are removed and the gate insulating layer 104 below the first conductive layer 106 is exposed after the over-etch is performed, the etch process can be stopped. The second protection layer 120 is also removed during the etch process on the first conductive layer 106.

Figure 1G:
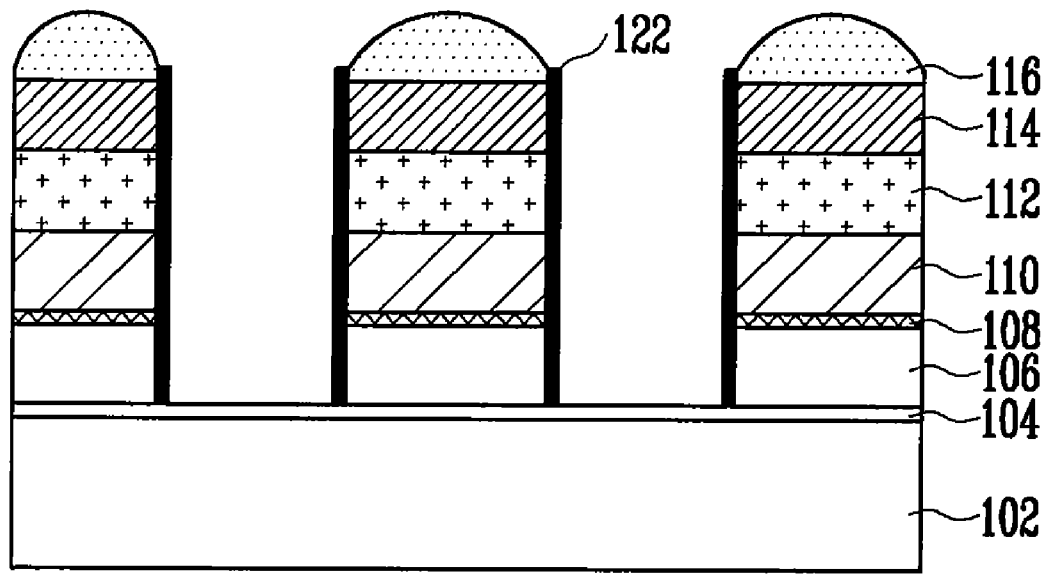

Referring to FIG. 1G, in order to compensate for damage occurring on the sidewalls while the stack layer patterns 106 to 114 are formed, an oxidization process is performed in-situ on the sidewalls of the stack layer patterns 106 to 114. An oxide layer 122 is formed on the sidewalls of the stack layer patterns 106 to 114 by the oxidization process. The oxidization process can be performed using a plasma oxidization method employing a mixed gas of Ar and $O_2$.

Figure 1H:
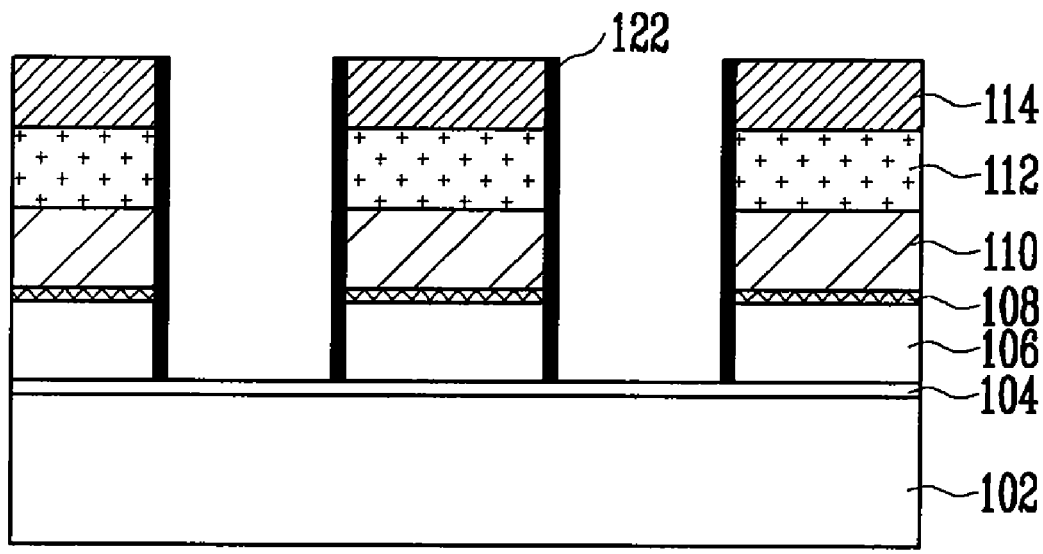

Referring to FIG. 1H, by removing the gate photoresist pattern 116 ex-situ, the formation of the gate of the semiconductor device is completed. Alternatively, the gate photoresist pattern 116 can be removed while forming the oxide layer 122 ex-situ.

As described above, in accordance with the method of forming a gate of a semiconductor device according to the present invention, in a gate etch process of forming a gate by etching a stack layer, the sidewalls of layers other than etch targets are protected by a buffer layer before performing the gate etch process. It is therefore possible to prevent the occurrence of a bowing profile on the sidewalls of the gate pattern by unnecessarily etching layers other than the etch targets. Accordingly, damage to the gate, which may occur due to the bowing profile, can be prevented, and semiconductor devices can be fabricated more reliably.

Although the foregoing description has been made with reference to a specific embodiment, it is to be understood that changes and modifications of the present patent may be made by one having ordinary skill in the art without departing from the spirit and scope of the present patent and appended claims.

What is claimed is:

1. A method of forming a gate of a semiconductor device, the method comprising:
    providing a semiconductor substrate over which a first conductive layer, a dielectric layer and a second conductive layer are formed;
    pattering the second conductive layer to expose a part of the dielectric layer;
    forming a first protection layer on sidewalls of the second conductive layer;
    removing the exposed dielectric layer and the first protection layer at the same time by a first etch process using the first protection layer as an etch mask, wherein the first protection layer prevents the second conductive layer over the dielectric layer from being etched during removal of the dielectric layer;
    forming a second protection layer on sidewalls of the second conductive layer; and
    removing the exposed first conductive layer and the second protection layer at the same time by a second etch process using the second protection layer as an etch mask, wherein the second protection layer prevents the second conductive layer over the first conductive layer from being etched during removal of the first conductive layer.

2. The method of claim 1, wherein the first conductive layer is formed of polysilicon.

3. The method of claim 1, wherein the second conductive layer is formed of polysilicon.

4. The method of claim 3, wherein the second conductive layer further includes a metal layer.

5. The method of claim 1, wherein the first protection layer and the second protection layer are formed using an oxide layer.

6. The method of claim 5, wherein the oxide layer is formed by a plasma oxidization method.

7. The method of claim 6, wherein the plasma oxidization method is performed using a mixed gas of Ar and $O_2$.

8. The method of claim 1, wherein during the first etch process, a part of the first conductive layer is removed.

9. The method of claim 1, wherein the first etch process is performed such that an oxide layer is etched more than polysilicon.

10. The method of claim 9, wherein the first etch process includes performing a dry etch process.

11. The method of claim 10, wherein the dry etch process is performed using $CF_4$.

12. The method of claim 1, wherein the second etch process includes:
    performing a primary etch in which a polysilicon layer is etched more than an oxide layer, and
    performing a secondary etch in which the polysilicon layer is etched more than the oxide layer in proportion to the primary etch.

13. The method of claim 12, wherein the primary etch employs a mixed gas of HBr and He.

14. The method of claim 12, wherein the secondary etch employs a mixed gas of HBr and $O_2$.

15. A method of forming a gate of a semiconductor device, the method comprising:
    forming a gate insulating layer, a first conductive layer, a dielectric layer, a second conductive layer, and a hard mask layer over a semiconductor substrate;

forming a stack layer pattern by etching the hard mask layer and the second conductive layer to expose the dielectric layer;

forming a first protection layer on sidewalls of the stack layer pattern;

removing the exposed dielectric layer and the first protection layer at the same time by a first etch process using the first protection layer as an etch mask, wherein the first protection layer prevents the stack layer pattern over the dielectric layer from being etched during removal of the dielectric layer;

forming a second protection layer on sidewalls of the stack layer pattern and the dielectric layer; and removing the exposed first conductive layer and the second protection layer at the same time to expose the gate insulating layer by a second etch process using the second protection layer as an etch mask, wherein the second protection layer prevents the stack layer pattern over the first conductive layer from being etched during removal of the first conductive layer.

16. The method of claim 15, wherein performing the first etch process further comprises removing a portion of the first conductive layer.

* * * * *